(12) United States Patent
De Jong et al.

(10) Patent No.: US 9,289,802 B2
(45) Date of Patent: Mar. 22, 2016

(54) LITHOGRAPHIC APPARATUS AND METHOD OF CLEANING A SURFACE OF AN IMMERSION LITHOGRAPHIC APPARATUS

(75) Inventors: Anthonius Martinus Cornelis Petrus De Jong, Pijnacker (NL); Hans Jansen, Eindhoven (NL); Josephus Cornelius Johannes Antonius Vugts, Goirle (NL); Jacques Cor Johan Van Der Donck, Alphen aan den Rijn (NL); Teunis Cornelis Van Den Dool, Delft (NL); Gerrit Oosterhuis, Best (NL)

(73) Assignee: ASML NETHERLANDS B.V., Veldhoven (NL)

(*) Notice: Subject to any disclaimer, the term of this patent is extended or adjusted under 35 U.S.C. 154(b) by 1114 days.

(21) Appl. No.: 12/314,611

(22) Filed: Dec. 12, 2008

(65) Prior Publication Data

US 2009/0174871 A1 Jul. 9, 2009

Related U.S. Application Data

(60) Provisional application No. 61/006,092, filed on Dec. 18, 2007.

(51) Int. Cl.
*G03B 27/52* (2006.01)
*B08B 3/02* (2006.01)
*B08B 5/02* (2006.01)
*G03F 7/20* (2006.01)

(52) U.S. Cl.
CPC ... *B08B 3/02* (2013.01); *B08B 5/02* (2013.01); *G03F 7/70341* (2013.01); *G03F 7/70925* (2013.01)

(58) Field of Classification Search
CPC ............. G03F 7/2041; G03F 7/70341; G03F 7/70908; G03F 7/70925; B08B 3/02; B08B 5/02; G08B 5/02
USPC ........... 355/30, 52, 53, 55, 67–71, 72, 73, 77; 430/5, 8, 22, 30, 311; 250/492.1, 250/492.2, 492.22, 493.1
See application file for complete search history.

(56) References Cited

U.S. PATENT DOCUMENTS

| | | | |
|---|---|---|---|
| 4,509,852 A | 4/1985 | Tabarelli et al. | |
| 5,853,962 A * | 12/1998 | Bowers | 430/331 |
| 5,931,721 A * | 8/1999 | Rose et al. | 451/89 |
| 6,496,257 B1 * | 12/2002 | Taniguchi et al. | 356/239.2 |
| 6,952,253 B2 | 10/2005 | Lof et al. | |
| 7,050,146 B2 | 5/2006 | Duineveld et al. | 355/30 |
| 7,091,502 B2 | 8/2006 | Gau et al. | 250/492.2 |
| 7,224,427 B2 | 5/2007 | Chang et al. | 355/30 |

(Continued)

FOREIGN PATENT DOCUMENTS

| | | |
|---|---|---|
| CN | 1963673 | 5/2007 |
| EP | 1 420 300 A2 | 5/2004 |

(Continued)

OTHER PUBLICATIONS

Japanese Office Action mailed Jul. 20, 2011 in corresponding Japanese Patent Application No. 2008-315117.

*Primary Examiner* — Christina Riddle
(74) *Attorney, Agent, or Firm* — Pillsbury Winthrop Shaw Pittman LLP

(57) ABSTRACT

A method of cleaning a lithography apparatus using an aerosol spray is described. The spray from the aerosol is contained in a space.

36 Claims, 7 Drawing Sheets

(56) References Cited

U.S. PATENT DOCUMENTS

| | | |
|---|---|---|
| 7,224,434 B2 | 5/2007 | Tokita .................... 355/53 |
| 7,307,263 B2 | 12/2007 | Bakker et al. ............. 250/492.2 |
| 7,315,033 B1 | 1/2008 | Pawloski et al. .......... 250/492.2 |
| 7,385,670 B2 | 6/2008 | Compen et al. ............. 355/30 |
| 7,405,417 B2 | 7/2008 | Stevens et al. ............ 250/504 R |
| 7,462,850 B2 | 12/2008 | Banine et al. ............. 250/504 R |
| 7,880,860 B2 | 2/2011 | Jansen et al. |
| 2003/0025889 A1* | 2/2003 | Hasegawa et al. .......... 355/30 |
| 2004/0132731 A1 | 7/2004 | Fox et al. |
| 2004/0136494 A1 | 7/2004 | Lof et al. |
| 2004/0207824 A1* | 10/2004 | Lof et al. ................ 355/30 |
| 2005/0024609 A1 | 2/2005 | De Smit et al. ............ 355/18 |
| 2005/0175776 A1 | 8/2005 | Streefkerk et al. ......... 427/256 |
| 2005/0259234 A1* | 11/2005 | Hirukawa et al. .......... 355/53 |
| 2005/0264774 A1 | 12/2005 | Mizutani et al. ........... 355/30 |
| 2005/0274898 A1 | 12/2005 | Watanabe et al. .......... 250/372 |
| 2006/0023185 A1 | 2/2006 | Hazelton et al. .......... 355/53 |
| 2006/0038968 A1 | 2/2006 | Kemper et al. |
| 2006/0050351 A1* | 3/2006 | Higashiki ................ 359/228 |
| 2006/0072085 A1* | 4/2006 | Compen .............. G03F 7/707 355/30 |
| 2006/0077367 A1* | 4/2006 | Kobayashi et al. .......... 355/53 |
| 2006/0103816 A1* | 5/2006 | Belfroid ............ G03F 7/70341 355/30 |
| 2006/0103818 A1 | 5/2006 | Holmes et al. ............ 355/53 |
| 2006/0105683 A1* | 5/2006 | Weygand et al. ........... 451/40 |
| 2006/0132731 A1* | 6/2006 | Jansen et al. ............. 355/30 |
| 2006/0158627 A1 | 7/2006 | Kemper et al. |
| 2006/0232757 A1 | 10/2006 | Tani et al. ............... 355/53 |
| 2006/0250588 A1 | 11/2006 | Brandl ................... 355/30 |
| 2006/0256316 A1 | 11/2006 | Tanno et al. ............. 355/72 |
| 2007/0002296 A1 | 1/2007 | Chang et al. ............. 355/53 |
| 2007/0026345 A1 | 2/2007 | Subramanian et al. ...... 430/311 |
| 2007/0064215 A1 | 3/2007 | Dirksen et al. ........... 355/77 |
| 2007/0068558 A1* | 3/2007 | Papanu et al. ............ 134/29 |
| 2007/0076197 A1 | 4/2007 | Koga .................... 356/237.3 |
| 2007/0085989 A1 | 4/2007 | Nagahashi et al. ......... 355/53 |
| 2007/0091287 A1* | 4/2007 | Chang et al. ............. 355/30 |
| 2007/0127001 A1 | 6/2007 | Van Der Hoeven .......... 355/53 |
| 2007/0146657 A1 | 6/2007 | Van Mierlo et al. ........ 355/30 |
| 2007/0146658 A1 | 6/2007 | Van Mierlo et al. ........ 355/30 |
| 2007/0147831 A1 | 6/2007 | Kaneyama et al. |
| 2007/0159610 A1 | 7/2007 | Shiraishi ................ 355/53 |
| 2007/0172234 A1 | 7/2007 | Shigemori et al. ......... 396/611 |
| 2007/0206279 A1 | 9/2007 | Brueck et al. ............ 359/391 |
| 2007/0229789 A1 | 10/2007 | Kawamura ................ 355/53 |
| 2007/0247600 A1 | 10/2007 | Kobayashi et al. ......... 355/30 |
| 2007/0251543 A1 | 11/2007 | Singh ................... 134/1 |
| 2007/0253710 A1 | 11/2007 | Kaneyama et al. ......... 396/611 |
| 2007/0258072 A1 | 11/2007 | Nagasaka et al. ......... 355/53 |
| 2007/0274711 A1 | 11/2007 | Kaneyama et al. ......... 396/611 |
| 2007/0285631 A1 | 12/2007 | Stavenga et al. .......... 355/30 |
| 2008/0002162 A1 | 1/2008 | Jansen et al. ............ 355/30 |
| 2008/0049201 A1 | 2/2008 | Stavenga et al. .......... 355/30 |
| 2008/0218712 A1 | 9/2008 | Compen et al. ........... 355/30 |
| 2008/0273181 A1 | 11/2008 | De Jong et al. .......... 355/30 |
| 2008/0284990 A1 | 11/2008 | De Jong et al. .......... 355/30 |
| 2009/0025753 A1 | 1/2009 | De Jong et al. .......... 134/10 |
| 2009/0027635 A1 | 1/2009 | De Jong et al. .......... 355/30 |
| 2009/0027636 A1 | 1/2009 | Leenders et al. ......... 355/30 |
| 2009/0091716 A1* | 4/2009 | Kadijk et al. ........... 355/30 |
| 2009/0174870 A1* | 7/2009 | De Jong et al. .......... 355/30 |

FOREIGN PATENT DOCUMENTS

| | | |
|---|---|---|
| JP | 56-008481 | 1/1981 |
| JP | 11-162831 | 6/1999 |
| JP | 2000-323396 | 11/2000 |
| JP | 2005-072404 | 3/2005 |
| JP | 2005-079222 | 3/2005 |
| JP | 2006-134999 | 5/2006 |
| JP | 2006-179909 | 7/2006 |
| JP | 2006-310706 | 11/2006 |
| JP | 2007-029973 | 2/2007 |
| JP | 2007-088328 | 4/2007 |
| JP | 2007-123882 | 5/2007 |
| JP | 2007-142217 | 6/2007 |
| JP | 2007-150102 | 6/2007 |
| JP | 2007-173732 | 7/2007 |
| JP | 2007-227543 | 9/2007 |
| JP | 2007-227580 | 9/2007 |
| WO | WO 99/49504 A1 | 9/1999 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

* cited by examiner

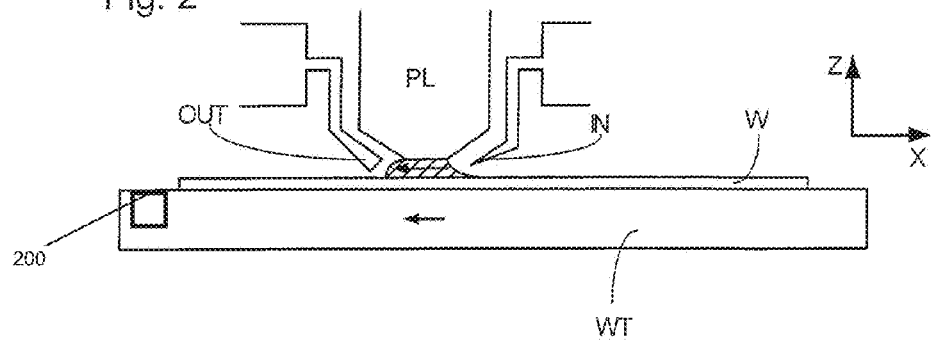
Fig. 2
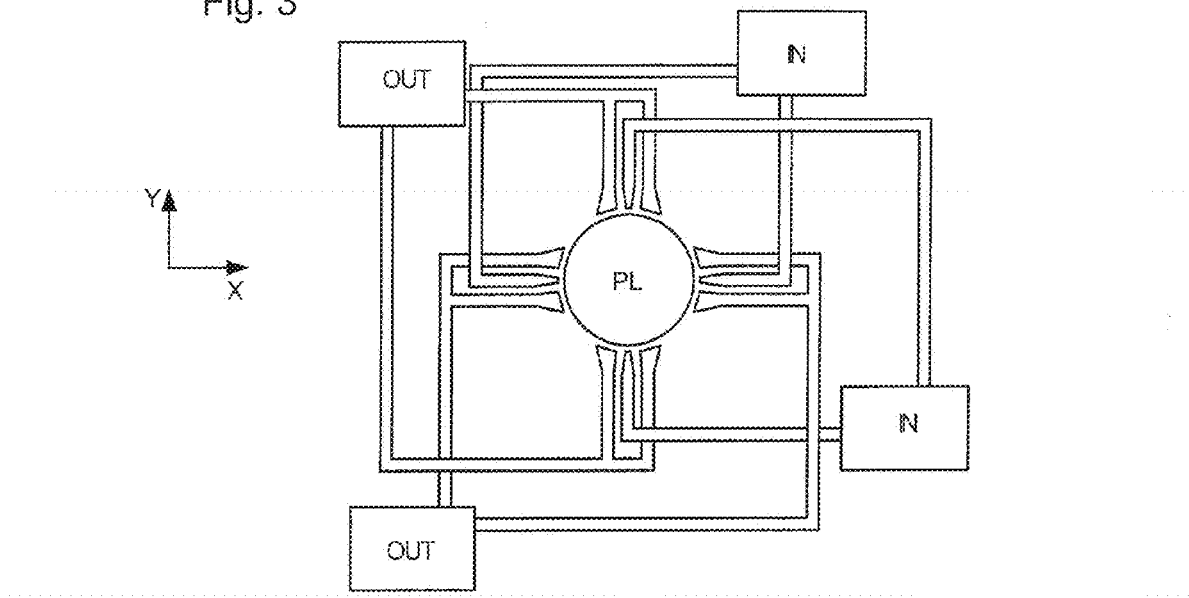
Fig. 3
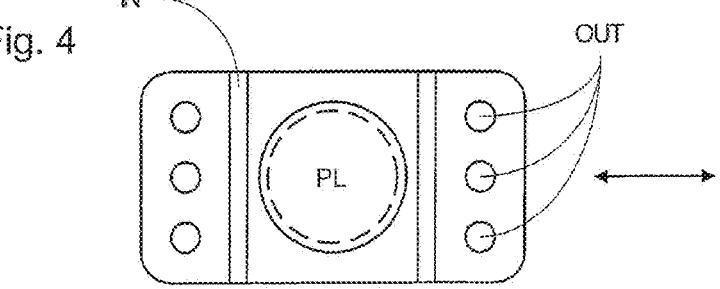
Fig. 4
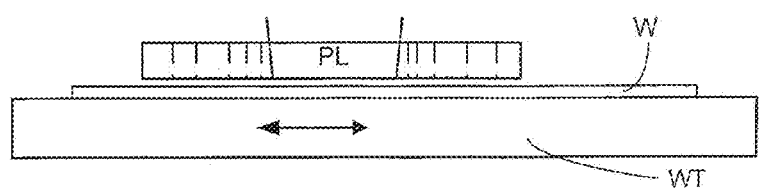

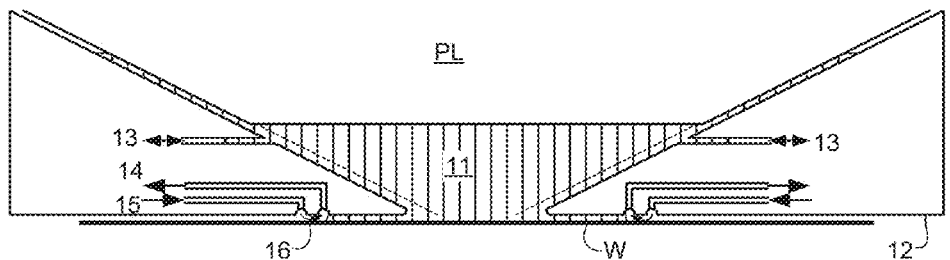
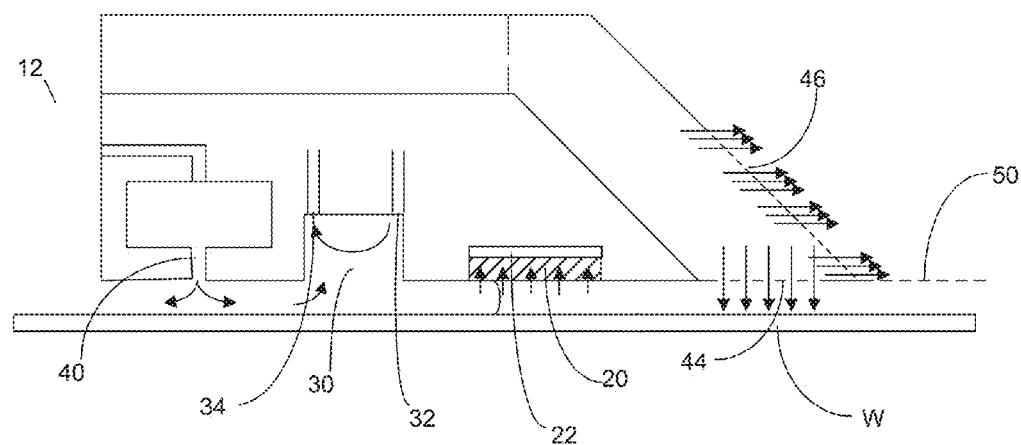
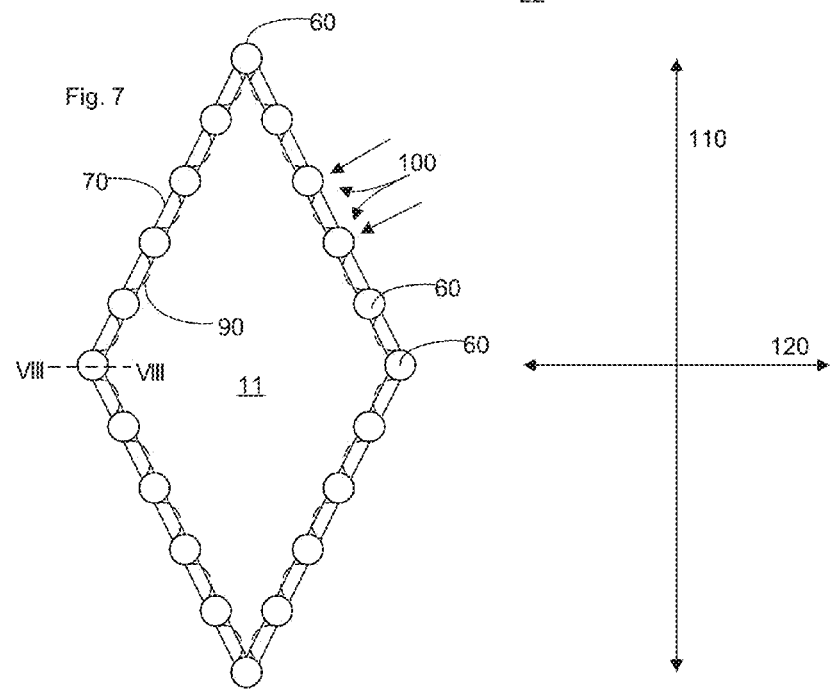

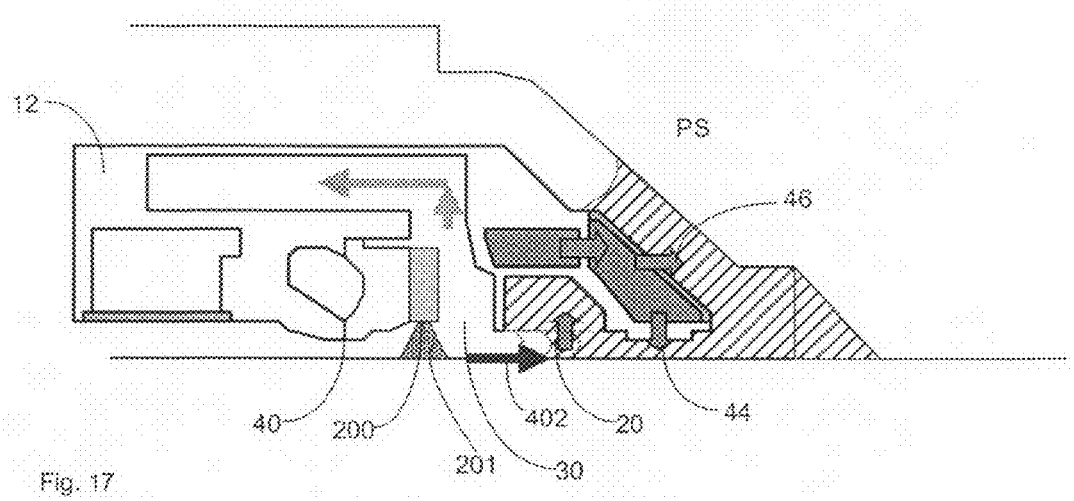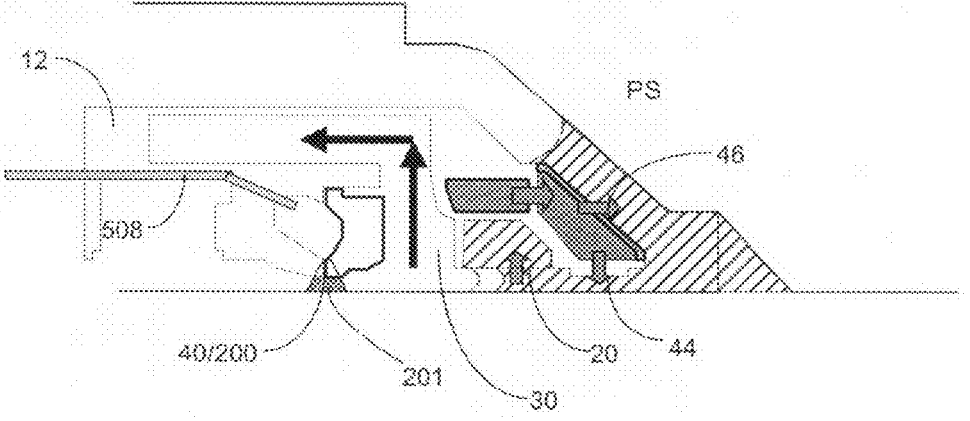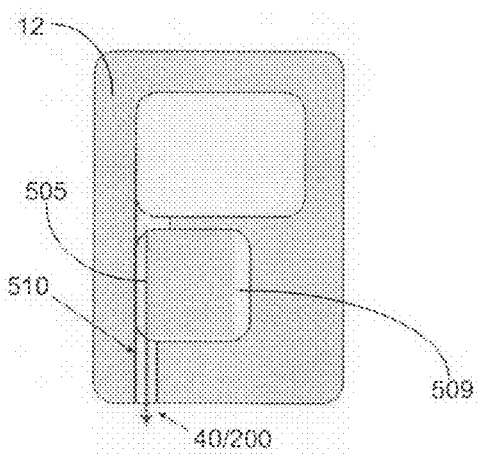

LITHOGRAPHIC APPARATUS AND METHOD OF CLEANING A SURFACE OF AN IMMERSION LITHOGRAPHIC APPARATUS

This application claims priority and benefit under 35 U.S.C. §119(e) to U.S. Provisional Patent Application No. 61/006,092, entitled "Lithographic Apparatus and Method of Cleaning a Surface of an Immersion Lithographic Apparatus", filed on Dec. 18, 2007. The content of that application is incorporated herein in its entirety by reference.

FIELD

The present invention relates to a lithographic apparatus and a method of cleaning a surface of an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although another liquid can be used. An embodiment of the present invention will be described with reference to liquid. However, another fluid may be suitable, particularly a wetting fluid, an incompressible fluid and/or a fluid with a higher refractive index than air, desirably a higher refractive index than water. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, a fluorohydrocarbon, and an aqueous solution.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the systems proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

One difficulty with immersion lithography apparatus is that of contamination. Contamination may be introduced via the immersion liquid as well as other mechanisms. Contamination may result in scratching of a surface and/or image defects being imparted to the substrate. Contaminating particles may also cause imaging defects if the particles obstruct the imaging beam of radiation during exposure of a pattern onto the substrate. If contamination, for example, on the top surface of the substrate table is not removed, the contamination may re-enter the immersion liquid.

US patent application publication no. US 2006/0132731 discloses cleaning of a final element of a projection system of an immersion lithographic apparatus with liquid. The liquid can be applied in a spray.

SUMMARY

It is desirable, for example, to provide an apparatus and method for cleaning lithography apparatus.

According to an aspect of the invention, there is provided an immersion lithography apparatus, comprising: an aerosol spray orifice for directing an aerosol spray at a surface to be cleaned.

According to an aspect of the invention, there is provided an immersion lithography apparatus comprising: an aerosol spray device for spraying an aerosol onto a surface to be cleaned; a confinement system for confining the aerosol to a space; and an extractor for removing, from the space, matter exiting the aerosol spray device.

According to an aspect of the invention, there is provided a method of cleaning a surface of an immersion lithographic apparatus, the method comprising: directing an aerosol spray at the surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 5 depicts, in cross-section, a liquid handling system;

FIG. 6 illustrates, in cross-section, a further liquid handling system;

FIG. 7 illustrates, in plan, a further liquid handling system;

FIG. 16 illustrates, in cross-section, an embodiment of the present invention;

FIG. 17 illustrates, in cross-section, an embodiment of the present invention; and FIG. 18 illustrates, in cross-section, a close up view of the embodiment of FIG. 17.

DETAILED DESCRIPTION

Figure 1:
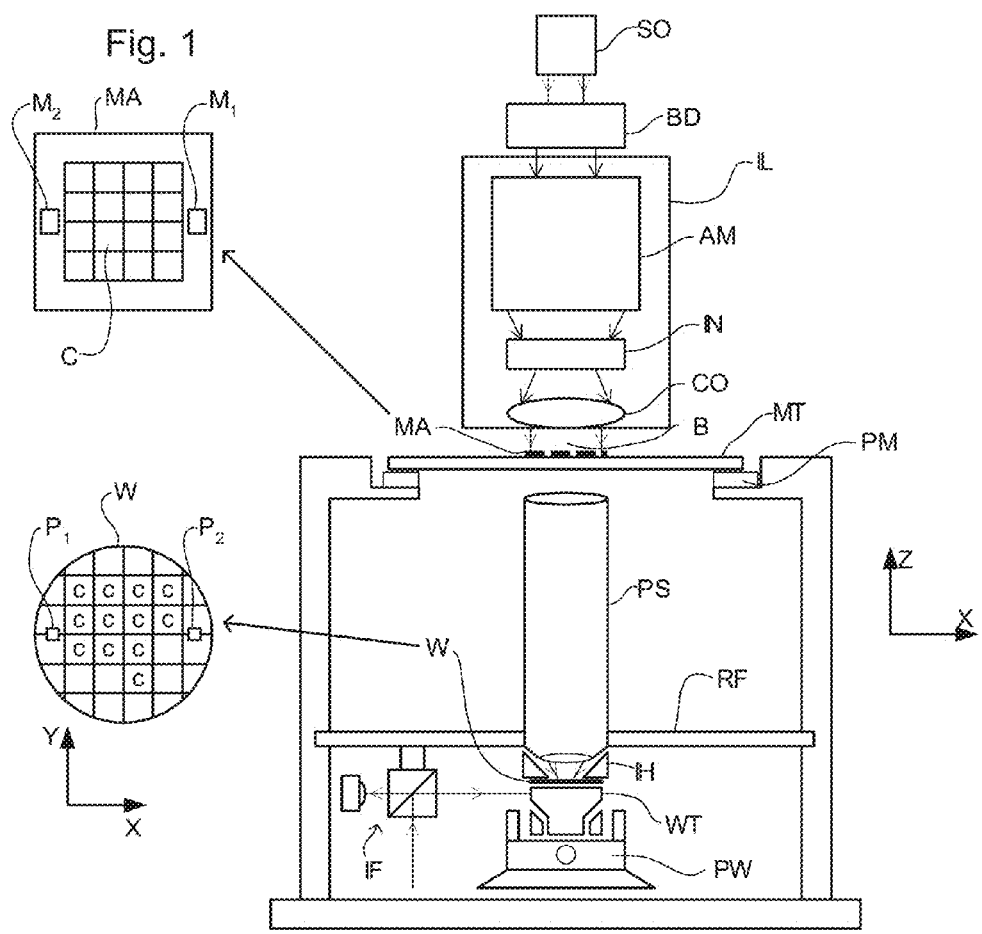
FIG. 1 depicts a lithographic apparatus according to an embodiment of the invention.
Figure 8:
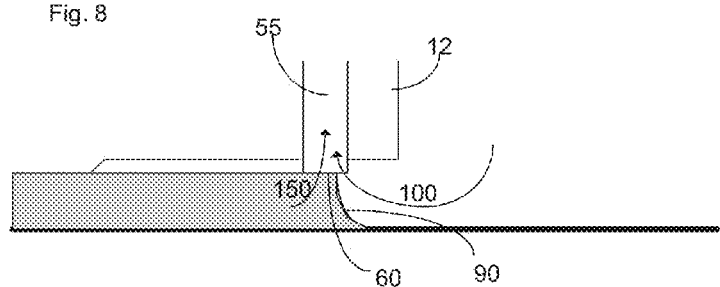
FIG. 8 illustrates, in cross-section, the liquid handling system of FIG. 7.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may alternatively be employed.

An embodiment of the present invention is related to cleaning an immersion lithographic apparatus. An embodiment of the invention makes use of an aerosol spray which is directed at the surface to be cleaned. The aerosol spray may comprise a dynamic collection of liquid and/or solid drops/particles which are entrained in surrounding gas. That is, the particles of liquid and/or solid are dispersed as a suspension in gas. In an embodiment, an inert gas is used, such as nitrogen or carbon dioxide. The solid or liquid may be water, for example ultra pure water or another solvent or cleaning fluid. The cleaning fluid may be ultra pure water or another agent such as a solvent and oxidizing agent, or other fluid. For example peroxide, a dissolved gas, detergent, soap in combination with a solvent, a halide, aldehyde, ozone, a non-polar organic solvent and a polar organic solvent may be used. A drying stain is usually a salt deposit and depending on the exact salt, a high or low pH solution may be used to dissolve the salt. Another detergent may be used to remove a metal deposit. For organic contaminants, an organic solvent such as heptane, hexane (which are non polar), alcohol, e.g. ethanol, or acetone (which are polar) may be used. As will be seen, the aerosol spray is confined to a space. When the spray impacts on the cleaning surface, the surface is almost free of liquid. Any liquid present is typically sub-micron thick. In this way the liquid and/or solid particles of the aerosol can directly impact their kinetic energy onto the surface to be cleaned. When the aerosol impacts on the surface to be cleaned, contamination is de-bonded. The de-bonded contamination is then directed along with the matter which has exited an aerosol spray orifice or outlet (gas and liquid and/or solid) to an outlet.

The basic principle is one of confined spraying. Both an off-line embodiment and an in-line implementation are possible. An embodiment of the present invention may be used for cleaning many components of an immersion lithographic apparatus. In particular, an embodiment of the present invention may be used for cleaning a substrate table which is for supporting a substrate of the immersion lithographic apparatus. Additionally, the method may be used for cleaning a liquid handling system of an immersion lithographic apparatus. Desirably the method can be used in-line. In that instance the aerosol orifice is positioned within the apparatus so that it can be moved into a position at which the appropriate surface is cleaned. Alternatively the aerosol spray orifice may be fixed in position and the surface to be cleaned can be moved under the orifice. If the aerosol spray orifice is provided in a surface of the substrate table WT, for example, this can be used to clean a liquid handling system, such as those illustrated in FIGS. 2-10. Therefore, it can be seen that an embodiment of the present invention relates to a lithography apparatus which comprises an aerosol spray orifice for directing an aerosol spray at a surface to be cleaned. The apparatus may further comprise a substrate table. The apparatus may further comprise a projection system. The apparatus may further comprise a liquid handling system. The liquid handling system may be for confining a liquid to a space between a substrate and the projection system. The liquid handling system may be a liquid confinement system and/or a barrier member.

Several of the embodiments make use of a barrier member which forms a contactless seal to the surface to be cleaned. Often the surface to be cleaned will be the top surface of the substrate table. Several types of contactless seal are available for use for this purpose. These types of contactless seal can be used for containment of the immersion liquid to a localized area of the substrate during imaging. Some of these types of seal are described below in relation to sealing immersion fluid. As will become clear from the below, these types of seal can be used in the confinement structure used in an embodiment of the present invention for confining matter which exits the aerosol spray orifice to a space.

Several embodiments of system which confine or contain liquid in a space between the final element of the projection system and the substrate will be described. This is merely to illustrate that an embodiment of the present invention can be used with many different sorts of system. An embodiment of the present invention is not limited only to the types of system disclosed herein and any type of system can be used.

An immersion lithography system with a localized liquid supply: system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its centre and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive). This system can be used to contain matter from an aerosol spray orifice.

Another immersion lithography system with a localized liquid supply system which has been proposed is to provide the liquid supply system with a barrier member which extends along at least a part of a boundary of the space between the final element of the projection system and the substrate table. Such a system is illustrated in FIG. 5. The barrier member is substantially stationary relative to the projection system in the XY plane though there may be some relative movement in the Z direction (in the direction of the optical axis). A seal may be formed between the barrier member and the surface of the substrate.

Referring to FIG. 5, reservoir 11 forms a contactless seal to the substrate around the image field of the projection system so that liquid is confined to fill a space between the substrate surface and the final element of the projection system. The reservoir is formed by a barrier member 12 positioned below and surrounding the final element of the projection system PL. Liquid is brought into the space below the projection system and within the barrier member 12. Liquid may be brought into and/or out of the space through a port 13. The barrier member 12 extends a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in U.S. Pat. No. 6,952,253. This type of system could be used to confine matter from an aerosol spray orifice.

FIG. 6 illustrates a barrier member 12 which is part of a liquid confinement system IH. The barrier member 12 extends around the periphery (e.g., circumference) of the final element of the projection system PS such that the barrier member is substantially annular in overall shape.

The function of the barrier member 12 is to help maintain or confine liquid in the space between the projection system PS and the substrate W so that the projection beam may pass through the liquid. The top level of liquid is simply contained by the presence of the barrier member 12 and the level of liquid in the space is maintained such that the liquid does not overflow over the top of the barrier member 12. A seal may be provided between the bottom of the barrier member 12 and the substrate W. In FIG. 6 the seal is a contactless seal and is made up of several components. Working radially outwardly from the optical axis of the projection system PS, there is provided a (optional) flow control plate 50 which extends into the space (though not into the path of the projection beam). The flow control plate 50 helps maintain parallel flow of the immersion liquid out of outlet 46 across the space. At the other side of the space, the liquid exits out through an inlet (not illustrated) opposite the outlet 46. The inlet may be at the same level as the outlet 46 (so that the immersion liquid flows across the space between the final element of the projection system and the substrate). The flow control plate 50 has through holes in it to reduce the resistance to movement in the direction of the optical axis of the barrier member 12 relative to the projection system PS and/or substrate W. Moving further radially outwardly along the bottom of the barrier member 12 there is then provided an outlet 44 which provides a flow of liquid in a direction substantially parallel to the optical axis towards the substrate. This flow of liquid is used to help fill any gap between the edge of the substrate W and the substrate table WT which supports the substrate. If this gap is not filled with liquid, bubbles are more likely to be included in the liquid in the space between the projection system PS and the substrate W when an edge of the substrate W crosses the seal. This is undesirable as it may lead to deterioration of the image quality.

Radially outwardly of the outlet 44 is an extractor assembly 20 to extract liquid from between the barrier member 12 and the substrate W. The extractor 20 will be described in more detail below and forms part of the contactless seal which is created between the barrier member 12 and the substrate W.

Radially outwardly of the extractor assembly is a recess 30 which may be connected through an inlet 32 to the atmosphere and via an outlet 34 to a low pressure source. Radially outwardly of the recess 30 is a gas knife 40. An arrangement of the extractor, recess and gas knife is disclosed in detail in U.S. patent application publication no. US 2006-0158627. However, in that document the arrangement of the extractor assembly is different.

The extractor assembly 20 is comprised of a liquid removal device or extractor or inlet such as the one disclosed in U.S. patent application publication no. US 2006-0038968. Any type of liquid extractor may be used. The liquid extractor, in an embodiment, comprises an inlet which is covered in a porous material which is used to separate liquid from gas to enable single-liquid phase liquid extraction. The inlet may be ring shaped, around the optical axis. Desirably the inlet may be annular; it may be continuous or discontinuous. A chamber 22 downstream of the porous material is maintained at a slight under pressure and is filled with liquid. The under pressure in the chamber 22 is such that the meniscuses formed in the holes of the porous material substantially prevent ambient gas being drawn into the chamber 22 of the liquid extractor 20. However, when the porous surface comes into contact with liquid there is no meniscus to restrict flow and the liquid can flow freely into the chamber 22 of the liquid extractor 20. The porous surface extends radially inwardly along the barrier member 12 (as well as around the space) and its rate of extraction varies according to how much of the porous material is covered by liquid.

An embodiment of the present invention will be described as using a system similar to that of FIG. 6 for the confinement of matter which exits the aerosol spray orifice. The invention is not limited to use of only this type of system.

FIG. 7 illustrates a meniscus pinning device which can, for example, replace the contactless sealing device 14, 15, 16 of FIG. 5. The meniscus pinning device of FIG. 7 comprises a plurality of discrete outlets 60. Each outlet 60 is illustrated as being circular though this is not necessarily the case. Indeed the outlet 60 may be square, oblong, triangular, an elongate slit, etc. Some example shapes are given in FIG. 10.

Each outlet 60 of the meniscus pinning device of FIG. 7 may be connected to a separate under pressure source. Alternatively each outlet 60 is connected to a common chamber (which may be annular) which is itself held at an under pressure. In this way a uniform under pressure at each outlet may be achieved. A ridge 70 may be provided between adjacent outlets 60. As can be seen from FIG. 8, which is a mirror image cross-section through lines VIII-VIII in FIG. 7, in one embodiment the outlet 60 is formed in a protrusion from the bottom surface of the barrier 12. The ridge 70 is positioned at the same height or protrudes by the same amount or less from the surface of the barrier member 12 as the outlet 60. The outlet 60 is an outlet of a tube or elongate passageway 55, for example. Desirably the outlet is positioned such that it faces the substrate W. Another way of thinking of this is that an elongate axis of the passageway 55 to which the outlet 60 is connected is substantially perpendicular (say +/−45°, 35°, 25° or 15° from perpendicular) to the top surface of the substrate W.

Each outlet 60 is designed to extract a mixture of liquid and gas. The liquid is extracted from the space 11 whereas the gas is extracted from the atmosphere on the other side of the outlet 60 and ridge 70 to the liquid. This creates a gas flow as illustrated by arrow 100 and this gas flow is effective to pin the meniscus 90 of the liquid in the space 11 between outlets 60 in place as illustrated in FIG. 7.

As can be seen from FIG. 9, the outlets and ridges are positioned so as to form, in plan, a polygonal shape. In one embodiment, the shape has at least one corner. The corner may be in the relative direction of movement of the substrate table, desirably at the trailing side of the meniscus pinning device. In the case of FIG. 7 this is in the shape of a rhombus with the principal axes 110, 120 aligned with the major directions of travel of the substrate W under the projection system. This helps ensure that the maximum scan speed is faster than if the outlets 60 and ridges 70 were arranged in a circular shape. This is because the force on the meniscus between two outlets is reduced with a factor cos θ, where θ is the angle of the line connecting the two outlets relative to the direction in which the substrate W and/or substrate table WT is moving. Thus, throughput may be optimized by making the primary axis 110 of the shape of the outlets aligned with the major direction of travel of the substrate (usually the scan direction) and to have a second axis 120 aligned with the other major direction of travel of the substrate (usually the step direction). It will be appreciated that any arrangement in which θ is different to 90° will give an advantage. Thus, exact alignment of the principal axes with the major directions of travel is not vital. It will further be appreciated that if the shape is circular, then there will always be two outlets 60 which are aligned perpendicular to the direction of travel so that the meniscus between those two outlets receives the maximum available force by movement of the substrate W. From the above, it can be seen that even the use of a square shape with the sides aligned at about 45° to the principal directions of travel of the substrate gives a great benefit. The ratio of the principal dimension of a square to the minor dimension is $\sqrt{2}$:1 and any shapes with such a ratio of greater than 1.2:1 are particularly suitable. For shapes with two principal axes, a length ratio of between 4/9 and 8/9, or between 5/9 and 7/9 may be particularly suitable bearing in mind the amount and speed of movement in the step and scan directions.

FIG. 8 illustrates that the outlet 60 is provided in a protrusion from the bottom surface of the barrier member 12. This is however not necessarily the case and the outlets 60 may be in the major bottom surface of the barrier member 12. In this case the liquid will abut the major bottom surface and thereby not have a free top surface which is prone to the undesirable generation of waves. In this case there is no definable ridge 70 as illustrated in FIG. 7. Arrow 100 shows the flow of gas from outside of the barrier member 12 into the passageway 55 associated with the outlet 60 and the arrow 150 illustrates the passage of liquid from the space 11 into the outlet 60. The passageway 55 and outlet 60 are designed so that two phase extraction (i.e. gas and liquid) may occur in an annular flow mode in which gas flows through the center of the passageway 55 and liquid flows along the walls of the passageway 55. This results in smooth flow without the generation of pulsations.

In FIG. 8, the level of liquid in the space 11 is arranged such that it does not touch the bottom surface of the barrier member 12 even radially inwardly of the outlet 60. As discussed above, that is however not necessarily the case. There are no meniscus pinning features radially inwardly of the outlet 60 and neither is there any other component or meniscus pinning feature radially outwardly of the outlet 60. Thus, in comparison to the liquid confinement system of FIG. 5, there is no gas inlet 15 or equivalent and the outlet 14 has been split into several discrete outlets 60 each connected to an under pressure source. The meniscus is pinned between the outlets 60 with drag forces induced by gas flow into the outlets 60. A gas velocity of greater than about 15 m/s, desirably 20 m/s should be sufficient to create the desired drag force. By avoiding, for example, use of a gas knife as is present in other liquid confinement systems, the amount of evaporation of liquid from the substrate may be reduced, thus reducing both splashing of liquid as well as thermal expansion/contraction effects.

However, a gas knife can be used with this embodiment if so desired. The gas knife would be positioned radially outwardly of the outlet 60.

Thirty-six discrete needles 60, each with a diameter of 1 mm and separated by 3.9 mm, may be effective to pin a meniscus. The total gas flow in such a system is of the order of 100 l/min.

Figure 9:
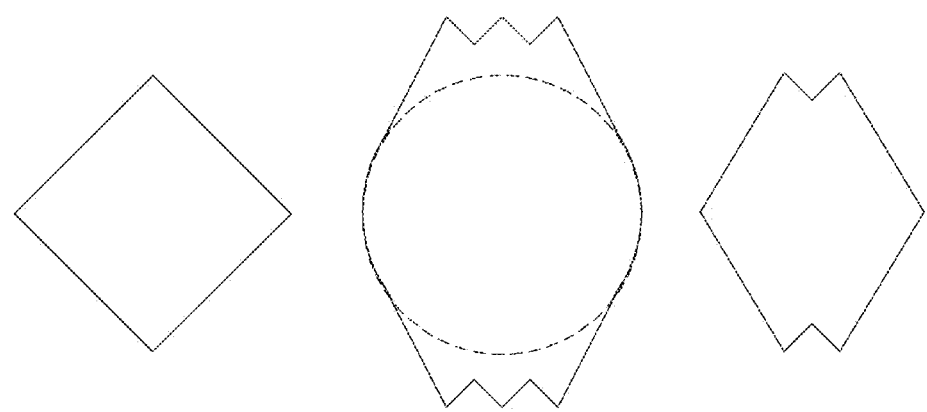
FIG. 9 illustrates, in plan, alternative shapes for the handling system of FIG. 7.

FIG. 9 shows, in plan, other geometries of arrangements of outlets which may be possible. These include a square and a variant on a circle (shown in dotted lines). In the variant of a circle, extensions at the top and bottom have been added which have the desired angle relative to the principal direction of travel. This design could be further modified to include similar extension for the other principal direction of travel. These shapes can be regarded as part stars, part circles. A complete star shape should work well. The final example is similar to the circle/star embodiment, but comprises all straight lines.

Figure 10:
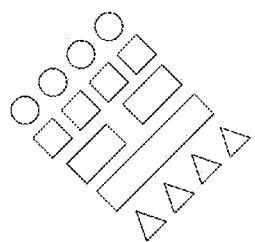
FIG. 10 illustrates, in plan, different outlet shapes for the liquid handling system of FIG. 7.

FIG. 10 illustrates some potential shapes of outlets and different spacings between the individual outlets. The outlets 60 may be slit shaped, continuous or discontinuous, be ellipsoid, circular, rectilinear, rectangular, rhomboidal, or triangular in cross-section, have a major axis substantially parallel or perpendicular to the ridge 70, and/or have a vertex (corner) parallel or substantially perpendicular to the ridge 70.

The embodiments of FIGS. 7-10 have been described because this type of system could be used to confine, to a space, matter which exits an aerosol spray orifice.

An embodiment of the present invention will now be described with reference to FIG. 11. This embodiment includes a confinement structure 208 which is similar to the system of FIG. 6. However, as has been described above, any confinement structure 208 could be used. Particularly the confinement structures of other systems illustrated in FIGS. 2-10 may be used. Any other system could be used, particularly those which form a contactless seal between themselves and a surface. This is true for any embodiment of the present invention.

Figure 11:
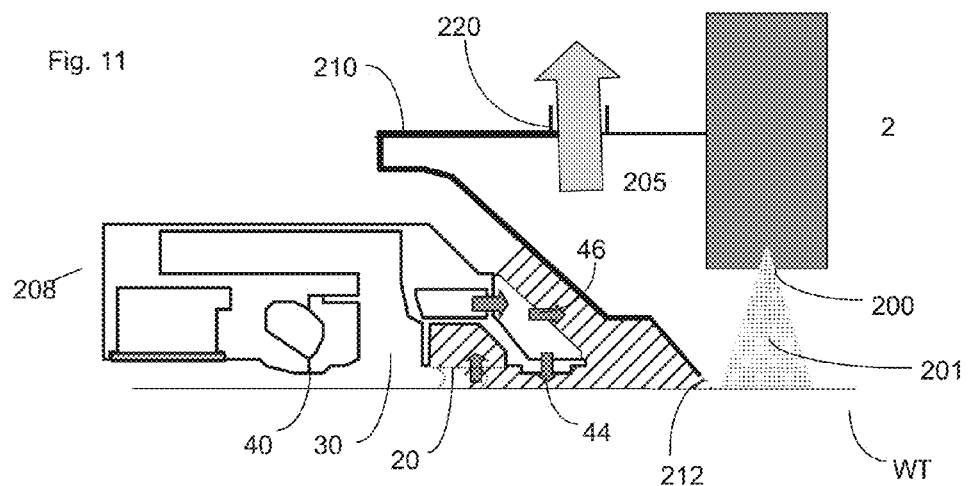
FIG. 11 illustrates, in cross-section, a cleaning assembly according to an embodiment of the present invention.

In FIG. 11 the cleaning device 2 is cleaning a portion of a surface of the substrate table WT. The substrate table WT may be moved under the cleaning device 2 and/or the cleaning device may be moved over the surface of the substrate table WT, so that all areas of the substrate table may be cleaned.

An aerosol spray orifice 200 is provided. The aerosol spray orifice 200 is arranged to direct an aerosol spray 201 at the surface to be cleaned. The aerosol spray 201 may be any of the above mentioned types of aerosol. A conduit for the provision of gas to the aerosol spray outlet and a conduit for the provision of a liquid and/or solid to the aerosol spray outlet may be provided.

After the aerosol spray 201 has impacted with the surface to be cleaned, the gas and liquid and/or solid particles are contained within a space 205. The gas is extracted through an outlet 220. Liquid and/or solid particles can be extracted through outlet 220 with the gas. Alternatively or additionally, liquid and/or solid particles can be extracted by a confinement structure 208. The confinement structure 208 is similar to that illustrated in FIG. 6. Liquid is provided through both outlets 46, 44 and liquid is extracted through extractor 20. The flow rate of liquid leaving outlets 44, 46 is typically in the range 20-100 ml/min. Therefore, liquid and/or solid particles on the surface of the substrate table WT which have come from the aerosol spray 201 enter the liquid provided by the confinement structure 208 and are then extracted through extractor 20.

In order to define the space 205 to which the matter exiting the aerosol spray orifice 200 is confined, one or more walls 210 are provided. The wall 210 is separate from the confinement structure 208. The wall 210 forms a barrier which substantially encloses a space 205 between the wall 210 and the surface to be cleaned. The aerosol spray orifice 200 is formed through the wall 210. A small gap 212 is left between the bottom of the wall 210 and the surface of the substrate table WT. The device 208 is used to seal the gap 212. This is done by the liquid provided through inlets 44, 46. That liquid has a meniscus which extends across the gap 212 between the bottom edge of the wall 210 and the substrate table WT. The meniscus is held in place because of a flow of gas exiting through the aerosol spray orifice 200 and impinging on the surface to be cleaned. After impinging on the surface to be cleaned that gas flow then moves up towards the outlet 220. Gas may be extracted through outlet 220 at a rate of approximately 1 m³/hour. Liquid on the surface to be cleaned can be incorporated into the liquid provided by the confinement structure 208 and can then be extracted by extractor 20.

Figure 13:
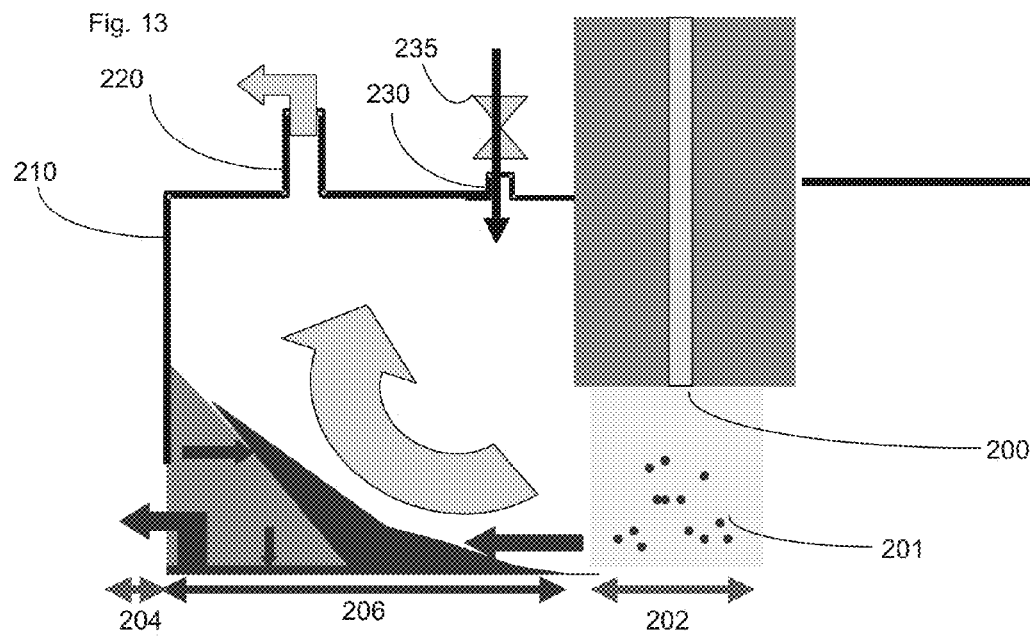
FIG. 13 illustrates, in cross-section, a detail of the embodiments of FIGS. 11 and 12.

The aerosol spray typically has a pressure of one bar with 50 ml ultra pure water per minute. This is effective to clean the surface in a cleaning zone 202 illustrated in FIG. 13. Desirably the cleaning zone 202 has a liquid thickness of less than 1 micron, if any liquid is present prior to cleaning. Such liquid may be present, for example, because of liquid being left behind by the confinement structure 208 as the surface to be cleaned moves relative to it or the liquid could be liquid which has been provided through the aerosol spray orifice 200. With reference to FIG. 13, radially outwardly of the cleaning zone is a wet zone 206 where liquid is present. Radially outwardly of the wet zone (i.e. radially outwardly of extractor 20) is a dry zone 204. Because the dry zone 204 has substantially no liquid and/or aerosol in contact with it, there is no re-deposition or drying stain which can form on the surface. This is so with most, if not all, embodiments.

It is advantageous to keep the pressure within the space 205 to which the matter exiting the aerosol spray orifice 200 is confined at a certain value, for example at atmospheric pressure. It may be necessary to provide a further opening 230 in the wall 210 through which gas can be allowed into the space 205 or through which gas can be taken out of the space 205. For this purpose a regulator 235 is provided. The regulator 235 can be controlled by a controller to regulate the flow of gas into and/or out of the space 205 and thereby regulate the pressure inside the space 205. The pressure is regulated to a certain value. In an embodiment, that certain value is atmospheric pressure.

Figure 12:
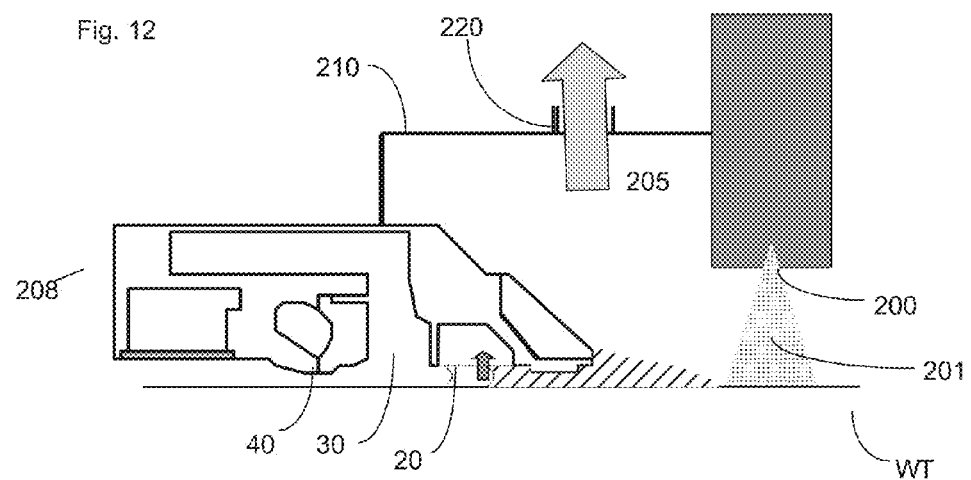
FIG. 12 illustrates an embodiment of a cleaning assembly of the present invention.

A further embodiment is illustrated in FIG. 12. This embodiment is the same as the embodiment described with respect to FIGS. 11 and 13 except as described below.

In this embodiment the wall 210 of the cleaning device is attached to (the top of) the confinement structure 208. No liquid is provided through inlets 44, 46 or those inlets are not present. The liquid which is illustrated in FIG. 12 is liquid which has been provided through the aerosol spray orifice 200. Thus, the extractor 20 is only extracting liquid which has been provided to the space 205 through the aerosol spray orifice 200. Although not illustrated in FIG. 12, it is possible to have an outlet 230 in the wall 210 and the regulator 235 as illustrated in FIG. 13.

With regard to the embodiments of FIGS. 11-13, although design of a liquid supply system to provide liquid to a space between the projection system and the substrate is used, the dimensions may be different to what might be used for that purpose. That is, the functionality is similar but the dimensions could be different. As will be appreciated, it is possible for the wall 210 to be attached to an existing barrier member 12 (for example the barrier member used to provide immersion liquid during imaging). This arrangement may be particularly suitable for use in-line. Furthermore, no separate hardware is needed which has a positive impact on costs as well as on available space in the apparatus.

Figure 14:
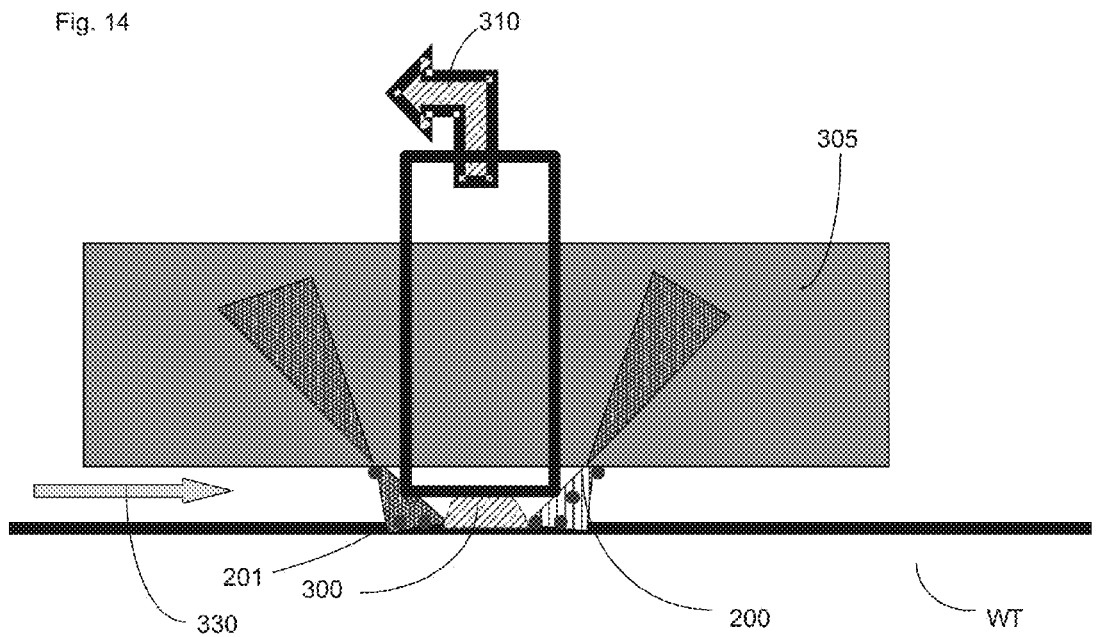
FIG. 14 illustrates, in cross-section, an embodiment of the present invention.

FIG. 14 illustrates a further embodiment. In the FIG. 14 embodiment an inlet 300 is provided in a surface. An under pressure source 310 is connected to the inlet 300. The aerosol spray orifice 200 at least partly surrounds the outlet 300. For example the aerosol spray orifice 200 may be annular. If the aerosol spray orifice 200 is annular then the outlet 300 is in the middle of the aerosol spray orifice 200. The aerosol spray orifice 200 may be continuous or discontinuous. That is, the orifice 200 may be a groove or it may be a series of individual outlet holes. In plan, the aerosol spray orifice 200 can have any shape and does not necessarily need to be annular. For example, the aerosol spray orifice 200 may be in plan square.

As can be seen, the aerosol spray orifice 200 is arranged such that the spray is directed at least partly radially inwardly. That is, towards an axis of the outlet 300. Because of the nature of a spray and the fact that it spreads out into roughly a cone shape, although the spray orifice directs the spray radially inwardly, not necessarily all of the spray will actually have a component in a direction radially inwardly; an outer part of the cone may have a component radially outwardly. However, the spray orifice 200 is constructed and arranged such that a majority of the spray will travel with a component radially inwardly down towards the surface to be cleaned.

Figure 15:
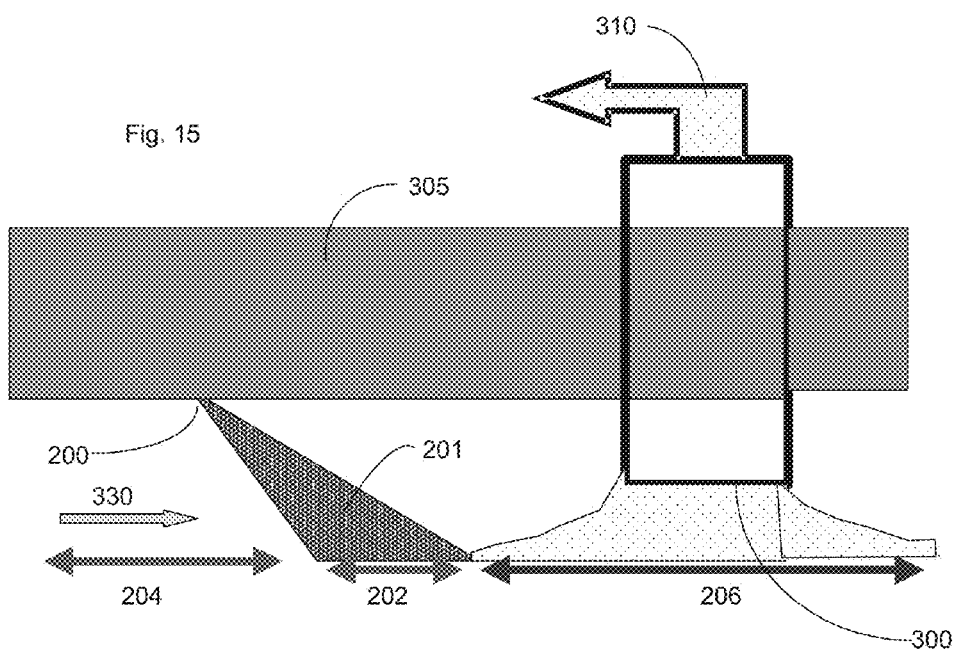
FIG. 15 illustrates, in cross-section, a detail of the embodiment of FIG. 14.

The matter which exits the aerosol spray orifice 200 will be extracted through outlet 300. This may include one or more of gaseous liquid and/or solid phases. The outlet 300 has an under pressure applied to it such that approximately one cubic meter of gas per hour may be extracted through it and approximately 3 liters per hour of liquid/solid is extracted through it. As a result, a radially inward flow of gas 330 in a position radially outwardly of the aerosol spray orifice 200 is generated. The radially inward flow of gas 330 passes between the surface to be cleaned and a body 305 of the device. The outlet 300 and aerosol spray orifice 200 are formed in the surface of the body 305 facing the surface to be cleaned. Radially outwardly of the cleaning zone 202 is a dry zone 204 (see FIG. 15). If 1000 mbar represents ambient atmospheric pressure, in the dry zone 204 the gas pressure will be at an over pressure of more than 1000 mbar, greater than 2000 mbar, greater 5000 mbar, greater than 10000:mbar or greater than 15000 mbar. The radially inward flow of gas 330 will be effective to keep this zone free of liquid and/or solid from the aerosol spray 201. Radially inwardly of the cleaning zone 202 before arriving at a liquid outlet zone 206 the gas will be at an under pressure relative to ambient atmospheric pressure of 1000 mbar, of less than 1000 mbar, of less than 800 mbar, of less than 500 mbar or of less than 100 mbar.

Thus, it can be seen that in the above embodiments of FIGS. 11-15 that a rotating/cylonic flow within the space 205 may created which facilitates keeping of the matter exiting the aerosol spray orifice 200 within a confinement zone. In an embodiment, an o-ring may be used to seal the cleaning area. Therefore, for example, the confinement structure 208 could be replaced by a simple o-ring. In that case liquid and/or solid exiting the aerosol spray orifice 200 would exit through the outlet 220.

FIG. 16 illustrates a further embodiment. The FIG. 16 embodiment includes a liquid handling system comprising a barrier member 12 similar to that illustrated in FIG. 6. In this embodiment, cleaning may be effected during imaging. This is the situation illustrated in FIG. 16. An aerosol spray orifice 200 is provided in a bottom surface of the barrier member 12 which supplies liquid to a space between the final element of the projection system PS and a substrate W. Liquid is supplied through inlets 44, 46 and is removed and substantially sealed in place by extractor 20. The function of the gas knife 40 is to confine liquid which escapes past the extractor 20. An aerosol spray orifice 200 is positioned radially outwardly of the extractor 20 and the recess 30 and radially inwardly of the gas knife 40. Therefore, during imaging (or at any other time that the liquid handling system is operative) the surface under the spray orifice 200 may be cleaned. This could be, for example, during a specific cleaning cycle. Gas exiting the aerosol spray orifice may be extracted through the recess 30. Liquid exiting the aerosol spray orifice which does not evaporate may be collected by the extractor 20 or may exit through the recess 30. The passage of this liquid is illustrated by arrow 402. Thus, it can be seen that in this embodiment a gas knife is used to create an over pressure which pushes the material which has exited the aerosol spray orifice towards the outlet of recess 30 and/or extractor 20.

A further embodiment is illustrated in FIG. 17. This embodiment is similar to the embodiment of FIG. 16. The difference is that in this embodiment the aerosol spray orifice 200 is the gas knife outlet 40. That is, in a particular mode the gas knife is provided (through a conduit 508) with liquid and/or solid particles which is/are entrained in the gas which ordinarily flows through the gas knife 40 thereby to form an aerosol spray 201 which exits the gas knife 40 outlet. If the outer width (e.g., diameter) of the gas knife is about 50 mm and the width of the gas knife is approximately 20 μm, the area of the gas knife is about $3.14 \times 10^{-6}$ m². With a flow rate of approximately 20 l/min, this gives a gas velocity of about 100 m/s. For example, liquid (e.g. water) may be provided to the gas knife at a rate of 10-50 ml/min. With a typical gas flow rate out of the gas knife, an aerosol is formed. The gas and liquid and/or solid particles exiting the gas knife of this embodiment are removed in the same way as described above in relation to the embodiment of FIG. 16. In this embodiment, an advantage is that an internal passage of the gas knife itself is cleaned. This is illustrated in FIG. 18 which is a detail of the gas knife of FIG. 17. Arrow 505 illustrates the gas flow out of the gas knife and arrow 510 illustrates an area where cleaning takes place.

In the embodiment of FIG. 17, the liquid may be supplied to the gas knife in small droplets. The droplets could, for example, be nano droplets. An advantage of providing the liquid as small droplets is that this may cause less or little pulsation in the system, so that there are fewer pressure fluctuations. The droplets may be provided directly into a chamber upstream of the gas knife outlet. For example, the droplets could be provided in chamber 509 illustrated in FIG. 18. Alternatively, the droplets may be entrained in the gas before the gas is supplied to the barrier member 12. Liquid may be provided in this way in any of the above embodiments, in particular the embodiment of FIG. 16.

The FIGS. 16 and 17 embodiments may be used with a so called "closing disc", i.e. a suitably shaped and sized member in place. In this instance, a member is placed under the extractor 20 and outlet 44 so that the space which the barrier member 12 surrounds (and to which it supplies liquid) is substantially enclosed. Thereafter the barrier member 12 may be moved over the surface to be cleaned, and/or vice versa, with only the gas knife 40 of the components on the bottom surface of the barrier member 12 operating. By providing the aerosol spray 201 as described above, it can be directed towards the surface to be cleaned. The closing disc is a type of shutter member which serves the same purpose. A shutter member may be a surface of the substrate table, it may be a separable part of the substrate table (so that it may be attachable to the barrier member and may be transported by the barrier member) or it may be the surface of another table, removably adjoining the substrate table.

An advantage of cleaning using an embodiment of this invention is that a dry surface is present after spraying. Furthermore, there is little or no re-deposition of contamination within the machine. The cleaning action may be confined to a limited surface area and may be done in minutes. The method may be used on any three dimensional surface. For example, features on the substrate table, such as: a sensor; a gap between a sensor and the substrate table; a gap between the substrate table and the substrate, without the substrate present (i.e. the opening to a fluid outlet defined in the surface of the substrate table); and a substrate support.

In a further embodiment, the orifice is in the substrate table. That is, the orifice is defined in a surface of the substrate table. This allows the under surface of the barrier member 12 to be cleaned. The part of the under surface of the barrier member to be cleaned is moved over the orifice in the substrate table, and/or vice versa, and the aerosol spray is directed at the surface to be cleaned.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath (in which the substrate may be submerged), only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithography apparatus, comprising:
   an aerosol spray orifice configured to direct an aerosol spray of solid or liquid particles suspended in gas at a surface to be cleaned; and
   an outlet configured to face the surface and exhaust at least part of the aerosol spray, a first portion of the aerosol spray orifice located at a first side of the outlet and a second portion of the aerosol spray orifice located at a second side, opposite the first side, of the outlet such that the outlet exhausts the at least part of the aerosol spray from the first and second portions.

2. The apparatus of claim 1, further comprising an under pressure source to remove gas which has exited the aerosol spray orifice.

3. The apparatus of claim 2, wherein the under pressure source is also configured to remove a liquid and/or a solid which has exited the aerosol spray orifice.

4. The apparatus of claim 1, wherein the aerosol spray orifice is situated in the apparatus such that cleaning of the surface can be performed in-line.

5. The apparatus of claim 1, wherein the surface is the surface of a substrate table, or of a barrier member configured to at least partly confine fluid to a space between a projection system and a substrate and/or a substrate table.

6. The apparatus of claim 1, further comprising a confinement structure configured to at least partly confine matter exiting the aerosol spray orifice to a space.

7. The apparatus of claim 6, wherein the confinement structure includes a gas orifice to pass gas into and out of the space.

8. The apparatus of claim 7, further comprising a regulator configured to regulate gas flow in/out of the gas orifice.

9. The apparatus of claim 8, further comprising a controller to control the regulator to control a pressure in the space.

10. The apparatus of claim 1, wherein the aerosol spray orifice is defined in a surface of a substrate table.

11. The apparatus of claim 1, wherein the aerosol spray orifice is defined in a bottom surface of a barrier member, wherein the barrier member is configured to at least partly confine fluid to a space between a projection system and a substrate and/or a substrate table.

12. The apparatus of claim 11, wherein the aerosol spray orifice is also an outlet for gas for use in containing fluid in the space during imaging.

13. The apparatus of claim 11, wherein the aerosol spray orifice is an outlet of a gas knife.

14. The apparatus of claim 1, wherein the aerosol spray orifice is constructed and arranged to direct the spray with a direction with a component towards a perpendicular of a surface in which the outlet is defined.

15. The apparatus of claim 1, wherein the surface is surrounded by a barrier member, which barrier member is configured to form a seal with an area surrounding the surface being cleaned.

16. The apparatus of claim 15, wherein the barrier member is configured to supply liquid to a space to which matter exiting the aerosol spray orifice is substantially confined.

17. The apparatus of claim 15, wherein the seal is a contactless seal and is at least partly formed by a gas flow.

18. The apparatus of claim 15, wherein the seal is a contactless seal and is at least partly formed by an under pressure source removing liquid from between the barrier member and the area surrounding the surface being cleaned.

19. The apparatus of claim 15, wherein the barrier member encloses a space above the surface being cleaned.

20. The apparatus of claim 1, wherein the aerosol spray orifice and/or surface are moveable relative to one another.

21. The apparatus of claim 1, wherein the surface is located in a confined space.

22. The apparatus of claim 1, configured to supply a liquid to a space between a projection system and a substrate and/or substrate table.

23. The apparatus of claim 1, further comprising a gas source to supply a gas to the aerosol spray orifice, and a liquid and/or solid source, separate from the gas source, to provide a liquid and/or a solid to the aerosol spray orifice to form the aerosol spray of particles of the solid or liquid suspended in the gas.

24. A lithography apparatus comprising:
an aerosol spray device configured to spray an aerosol of solid or liquid particles suspended in gas onto a surface to be cleaned;
a confinement system configured to at least partly confine the aerosol to a space, the confinement system comprising an outlet configured to face the surface and exhaust at least part of the aerosol spray, a first portion of the aerosol spray orifice located at a first side of the outlet and a second portion of the aerosol spray orifice located at a second side, opposite the first side, of the outlet such that the outlet exhausts the at least part of the aerosol spray from the first and second portions; and
an extractor configured to remove, from the space, matter exiting the aerosol spray device.

25. The apparatus of claim 24, wherein the confinement system comprises a barrier wall.

26. The apparatus of claim 24, wherein the confinement system is configured to use a gas flow to confine aerosol to the space.

27. The apparatus of claim 24, configured to supply a liquid to a space between a projection system and a substrate and/or substrate table.

28. A method of cleaning a surface of a lithographic apparatus, the method comprising:
directing an aerosol spray of solid or liquid particles suspended in gas at the surface using an aerosol spray orifice; and
exhausting at least part of the aerosol spray using an outlet facing the surface, wherein a first portion of the aerosol spray orifice is located at a first side of the outlet, a second portion of the aerosol spray orifice is located at a second side, opposite the first side, of the outlet and the outlet exhausts the at least part of the aerosol spray from the first and second portions.

29. The method of claim 28, further comprising removing a liquid or a solid introduced by the aerosol from the surface.

30. The method of claim 28, wherein gas and liquid and/or solid from the aerosol is substantially confined to and removed from a space.

31. The method of claim 30, wherein the gas and liquid and/or solid is confined, at least partly, by use of a confinement structure.

32. The method of claim 30, wherein the gas and liquid and/or solid is confined, at least partly, by a barrier member which at least partly surrounds the surface and which forms a contactless seal between itself and an area surrounding the surface being cleaned.

33. The method of claim 28, wherein the aerosol is applied by a gas knife which forms part of a seal between a barrier member and a substrate and/or substrate table, which barrier member is for at least partly containing immersion fluid in a space between a final element of a projection system and the substrate and/or substrate table.

34. The method of claim 28, wherein the surface is located in a confined space.

35. The method of claim 28, further comprising supplying a liquid to a space between a projection system of the lithographic apparatus and a substrate and/or substrate table.

36. The method of claim 28, further comprising supplying a gas to the aerosol spray device, and providing a liquid and/or a solid, separately from the gas, to the aerosol spray device to form the aerosol spray of particles of the solid or liquid suspended in the gas.

* * * * *